United States Patent
Takahashi

(10) Patent No.: US 10,909,942 B2
(45) Date of Patent: Feb. 2, 2021

(54) DRIVE CIRCUIT AND DISPLAY APPARATUS

(71) Applicant: SAKAI DISPLAY PRODUCTS CORPORATION, Sakai (JP)

(72) Inventor: Yoshihisa Takahashi, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 29 days.

(21) Appl. No.: 16/323,321

(22) PCT Filed: Aug. 5, 2016

(86) PCT No.: PCT/JP2016/073150
§ 371 (c)(1),
(2) Date: Feb. 5, 2019

(87) PCT Pub. No.: WO2018/025412
PCT Pub. Date: Feb. 8, 2018

(65) Prior Publication Data
US 2020/0193925 A1 Jun. 18, 2020

(51) Int. Cl.
*G09G 3/36* (2006.01)

(52) U.S. Cl.
CPC ......... *G09G 3/3648* (2013.01); *G09G 3/3674* (2013.01); *G09G 2310/0286* (2013.01); *G09G 2310/08* (2013.01)

(58) Field of Classification Search
CPC .............. G09G 3/3648; G09G 3/3674; G09G 2310/08; G09G 2310/0286
See application file for complete search history.

(56) References Cited

U.S. PATENT DOCUMENTS

| | | | |
|---|---|---|---|
| 2012/0249502 A1 | 10/2012 | Takahashi et al. | |
| 2014/0011195 A1 | 1/2014 | Honisch et al. | |
| 2014/0111495 A1* | 4/2014 | Iwase | G09G 3/3677 345/211 |

(Continued)

FOREIGN PATENT DOCUMENTS

| | | |
|---|---|---|
| JP | 5132818 B2 | 1/2013 |
| WO | 2012-161042 A1 | 11/2012 |
| WO | 2014-141800 A1 | 9/2014 |

OTHER PUBLICATIONS

International Search Report of PCT/JP2016/073150 in English.

*Primary Examiner* — Alexander Eisen
*Assistant Examiner* — Kebede T Teshome
(74) *Attorney, Agent, or Firm* — ScienBiziP, P.C.

(57) ABSTRACT

Provided are a drive circuit capable of preventing a malfunction of the circuit, and a display apparatus. Each of the multiple shift registers comprising an output switching element and a first input switching element, wherein one or more shift registers of the multiple shift registers comprise a control switching element, wherein a first controlled terminal is connected to either an output control node to which a second controlled terminal of the first input switching element and a control terminal of the output switching element are connected or a second controlled terminal of the output switching element, and a second controlled terminal is connected to a predetermined electric potential, wherein a first clear signal to be high level at or before a time point when an predetermined clock signal rises is input to a control terminal of the control switching element.

9 Claims, 15 Drawing Sheets

(56) References Cited

U.S. PATENT DOCUMENTS

2014/0306948 A1* 10/2014 Iwamoto .............. G09G 3/3677
                                                    345/213
2016/0042806 A1   2/2016  Ogawa et al.

* cited by examiner

DRIVE CIRCUIT AND DISPLAY APPARATUS

TECHNICAL FIELD

The invention relates to a drive circuit and a display apparatus.

BACKGROUND ART

In recent years, liquid crystal displays (LCD), which typifies flat panel displays, have been widely used not only in the field of small or medium-sized panel, but also in the field of large panel, such as for TV. Active matrix type liquid crystal display apparatus is widely used in such liquid crystal displays.

The display panel of an active matrix liquid type crystal display apparatus includes a plurality of source bus lines (video signal lines), a plurality of gate bus lines, pixel-forming units, and others. The pixel-forming units are provided at portions where the plurality of source bus lines and the plurality of gate bus lines are crossed, thereby arranged in a matrix. Each pixel-forming units comprises a thin film transistor, a pixel capacitor for holding pixel voltage value, and the like. A gate terminal of the thin film transistor is connected to a gate bus line that passes a portion where the gate bus line and a source bus line cross. Also, a source terminal of the thin film transistor is connected to the source bus line passing through that portion. Also, the active matrix liquid crystal type display apparatus comprises a gate driver for driving the gate bus lines, a source driver for driving the source bus lines, and the like.

One source bus line is not possible to simultaneously transfer video signals representing pixel voltage values for multiple rows. Therefore, writing (charging) of video signals to pixel capacitors in pixel-forming units arranged in a matrix needs to be performed sequentially for one row at a time. Thus, the gate driver (a drive circuit) has a configuration in which more than on shift registers are connected to each other so that multiple gate bus lines are sequentially selected for a predetermined period. The gate driver, based on a plurality of clock signals, outputs a drive signal sequentially from shift registers in each row to each gate bus line (see Patent Document 1).

PRIOR ART DOCUMENT

Patent Document

Patent Document 1: JP 5132818 B

SUMMARY OF THE INVENTION

Problem to be Solved by the Invention

However, in a conventional drive circuit such as disclosed in Patent Document 1, there is a possibility that a circuit may make a malfunction if noise occurs in the shift register when a clock signal rises The present invention has been made in view of such circumstances as mentioned above, and an object thereof is to provide a drive circuit capable of preventing a malfunction of the circuit and a display apparatus including the drive circuit.

Means to Solve the Problem

A drive circuit according to embodiment of the invention is a drive circuit with multiple shift resisters to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal, wherein each of the multiple shift registers comprising: an output switching element to output a drive signal from a second controlled terminal, wherein a predetermined clock signal is input to a first controlled terminal; and a first input switching element, wherein a set signal to be high level during a predetermined set period is input to a first controlled terminal, and a second controlled terminal is connected to a control terminal of the output switching element; wherein one or more shift registers of the multiple shift registers comprise: a control switching element, wherein a first controlled terminal is connected to either an output control node to which the second controlled terminal of the first input switching element and the control terminal of the output switching element are connected or the second controlled terminal of the output switching element, and a second controlled terminal is connected to a predetermined electric potential, wherein a first clear signal to be high level at or before a time point when the predetermined clock signal rises is input to a control terminal of the control switching element.

A display apparatus according to an embodiment of the present invention comprises a drive circuit according to the embodiment of the present invention.

Effects of the Invention

According to the invention, it is possible to prevent a malfunction of the circuit.

EMBODIMENT FOR CARRYING OUT THE INVENTION

Figure 1:
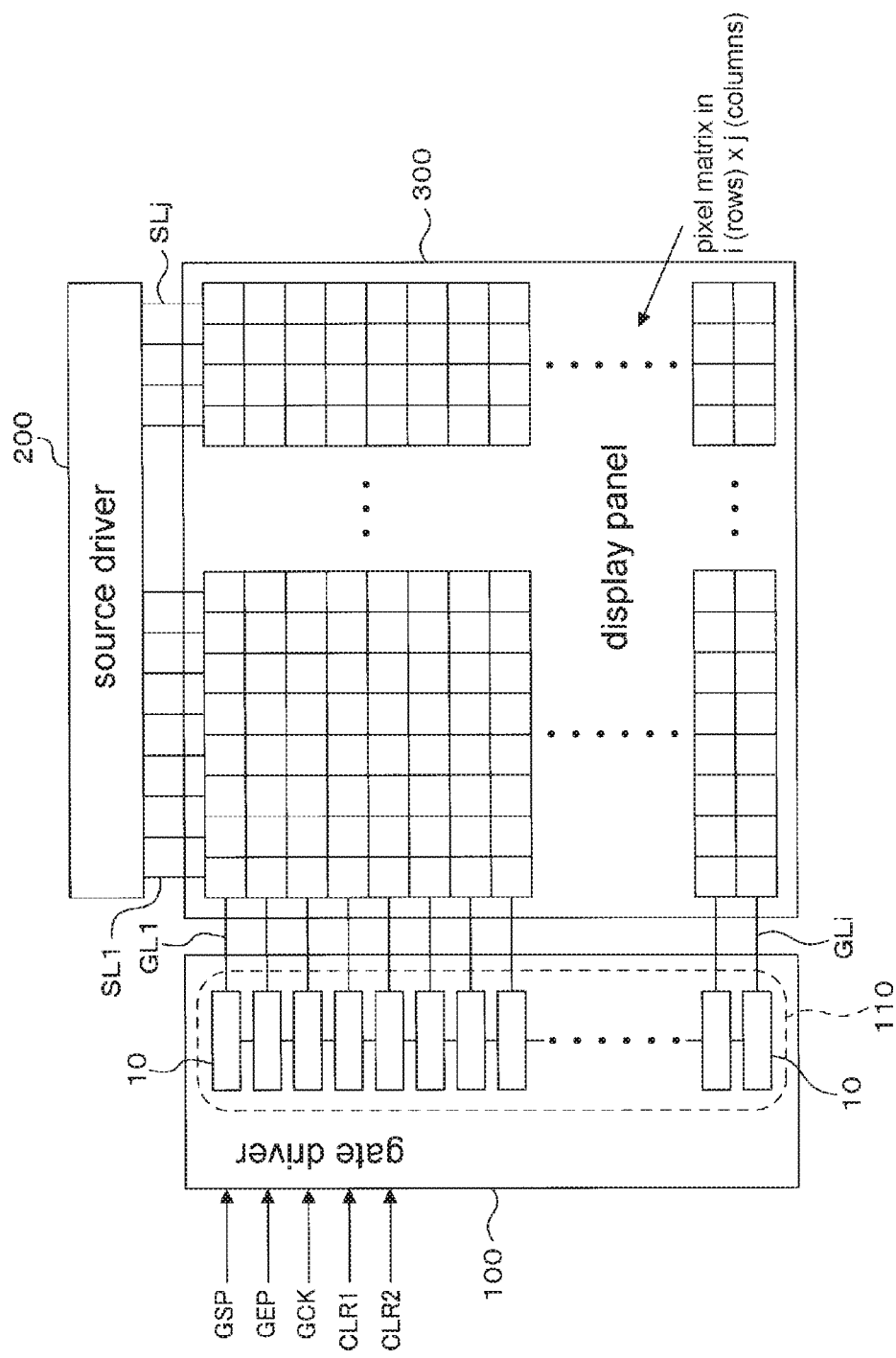
FIG. 1 is a schematic view showing an example of a main part of a display apparatus including a drive circuit of the present embodiment.

In the following, exemplary embodiments of the present invention will be described in terms of drawings. FIG. 1 is a schematic view showing an example of a main part of a display apparatus including a drive circuit according to the present embodiment. The display apparatus of the present embodiment is, for example, an active-matrix type liquid crystal display apparatus. As shown in FIG. 1, the display apparatus includes a gate driver 100 (also referred to as a drive circuit for scan signal line) as a drive circuit, a source driver 200 (also referred to as a drive circuit for video signal line), a display panel 300, and so on. It can be appreciated that the gate driver 100 is formed on the display panel 300 with, for example, amorphous silicon, polycrystalline silicon, microcrystalline silicone, oxide semiconductor, or others. In particular, the gate driver 100 is formed on a translucent pixel substrate (also referred to as an active matrix substrate, a cell-arrayed substrate).

A plurality of source bus lines (video signal lines, and in the example of FIG. 1, j source bus lines) SL1-SLj is connected to the display panel 300 and the source driver 200. Also, a plurality of gate bus lines (in the example of FIG. 1, i gate bus lines) GL1-GLi is connected to the display panel 300 and the gate driver 100. At each point where the plurality of source bus lines and the plurality of gate bus lines are crossed, a pixel forming unit is provided. The pixel forming units are arranged in a matrix and include TFTs (Thin Film Transistors), pixel capacitors for storing a pixel voltage value, and others.

The source driver 200 outputs a video signal for driving to each of the source bus lines SL1-SLj based on signals such as a digital video signal, a source start pulse signal, and a source clock signal which are output from a display control circuit (not shown).

The gate driver 100 includes a shift register group 110 in which multiple shift registers 10 are connected to each other. In the specification, for convenient sake, each shift register 10 and a shift register group 110 is also simply referred to as a shift register.

The gate driver 100 sequentially outputs a drive signal to each of the gate bus lines GL1-GLi based on a gate start pulse signal (also referred to as a shift register operation start signal) GSP, a gate end pulse signal (also referred to as a shift register operation end signal) GEP, a clock signal GCK, a first clear signal CLR1, a second clear signal CLR2, and others which are output from the display control circuit (not shown). For convenient sake, clock signals from each phase are collectively represented as one clock signal GCK. The drive signal is output to each of the gate bus lines GL1-GLi at every single vertical scanning period repeatedly.

Figure 2:
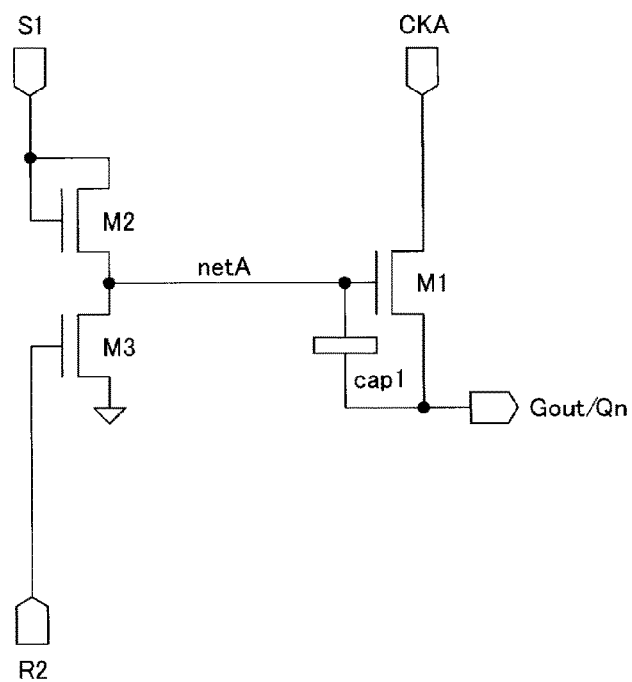
FIG. 2 is a circuit diagram showing an example of a basic configuration of a shift register.
Figure 3:
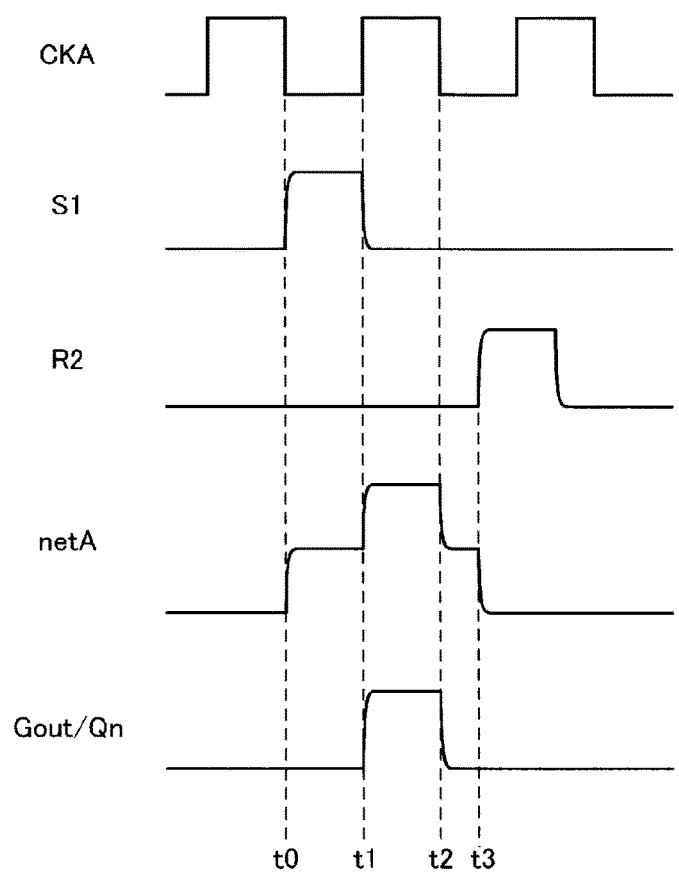
FIG. 3 is a timing chart showing an example of the operation of the shift register shown in FIG. 2.

In the following, the shift register is described. FIG. 2 is a circuit diagram showing an example of a basic configuration of the shift register, and FIG. 3 is a timing chart showing an example of the operation of the shift register shown in FIG. 2. The timing chart shown in FIG. 3 shows the operation of the shift register illustrated in FIG. 2. As shown in FIG. 2, the shift register includes thin film transistors M1-M3 as three switching elements and one capacitor cap 1. In the specification, a drain, a source and a gate of a thin film transistor are also referred to as a first controlled terminal, a second controlled terminal and a control terminal, respectively.

More specifically, the shift register includes an output thin film transistor M1, wherein a predetermined clock signal CKA is input to a drain, and the drive signal is output from a source to an output node (Gout/Qn), a first input thin film transistor M2, wherein a predetermined set signal (which is, for example, output from a shift register in an anterior stage side to the above-mentioned shift register, represented as Reference Sign S1) is input to a drain, a source is connected to a gate of the output thin film transistor M1, and a gate is connected to the drain; a second input thin film transistor M3, wherein a drain is connected to an output control node (also referred to as net A) to which the source of the first input thin film transistor M2 and the gate of the output thin film transistor M1 are connected, a predetermined electric potential is applied to a source, a predetermined reset signal (which is, for example, output from a shift register in a posterior stage side to the above-mentioned shift register, represented as Reference Sign R2) is input to the gate, and the like. Also, the capacitor cap 1 is connected between the gate and the source of the output thin film transistor M1.

As shown in FIG. 3, when a set signal S1 is input at the time point t0, the first input thin film transistor M2 is turned into an on state, and the capacitor cap 1 is charged (precharged). Accordingly, the electric potential of the output control node (net A) is changed from low level to high level, and the output thin film transistor M1 is turned into an on state. However, between the time points to and t1 when the set signal S1 is in high level (also referred to as a set period), the clock signal CKA is in low level, and thus the electric potential of the output node (Gout/Qn) is maintained in low level.

At the time point t1, the set signal S1 is changed from high level to low level. Because the reset signal R2 is in low level, the second input thin film transistor M3 is in an off state. Therefore, the output control node (net A) is in a floating state. Then, when the clock signal CKA is changed from low level to high level at the time point t1, the electric potential of the output control node (net A) rises (net A is bootstrapped) in accordance with increase of the electric potential of the drain of the output thin film transistor M1 because an electric charge charged in the capacitor cap1 maintains the electric potential difference between the output control node (net A) and the output node (Gout). Consequently, the output thin film transistor M1 is turned into an on state, and the electric potential of the output node (Gout/Qn) rises. The period between the time point t1 and the below-mentioned t2 is also referred to as a selection period.

At the time point t2, the clock signal CKA is change from high level to low level. At the time point t2, the output thin film transistor M1 is in an on state, and thus the electric potential of the output node (Gout/Qn) falls in accordance with a decrease of the electric potential of the drain of the output thin film transistor M1. Also, the electric potential of the output control node (net A) falls in accordance with decrease of the electric potential of the output node (Gout/Qn).

At the time point t3, when the reset signal R2 is changed from low level to high level, the second input thin film transistor M3 is turned into an on state, and the electric potential of the output control node (net A) falls to low level. The period in which the reset signed R2 is in high level is also referred to as a reset period. It can be appreciated that the example in FIG. 3 describes the case that the time point t2 and the time point t3 is different, however, the time point t2 and the time point t3 may be the same time point.

Figure 4:
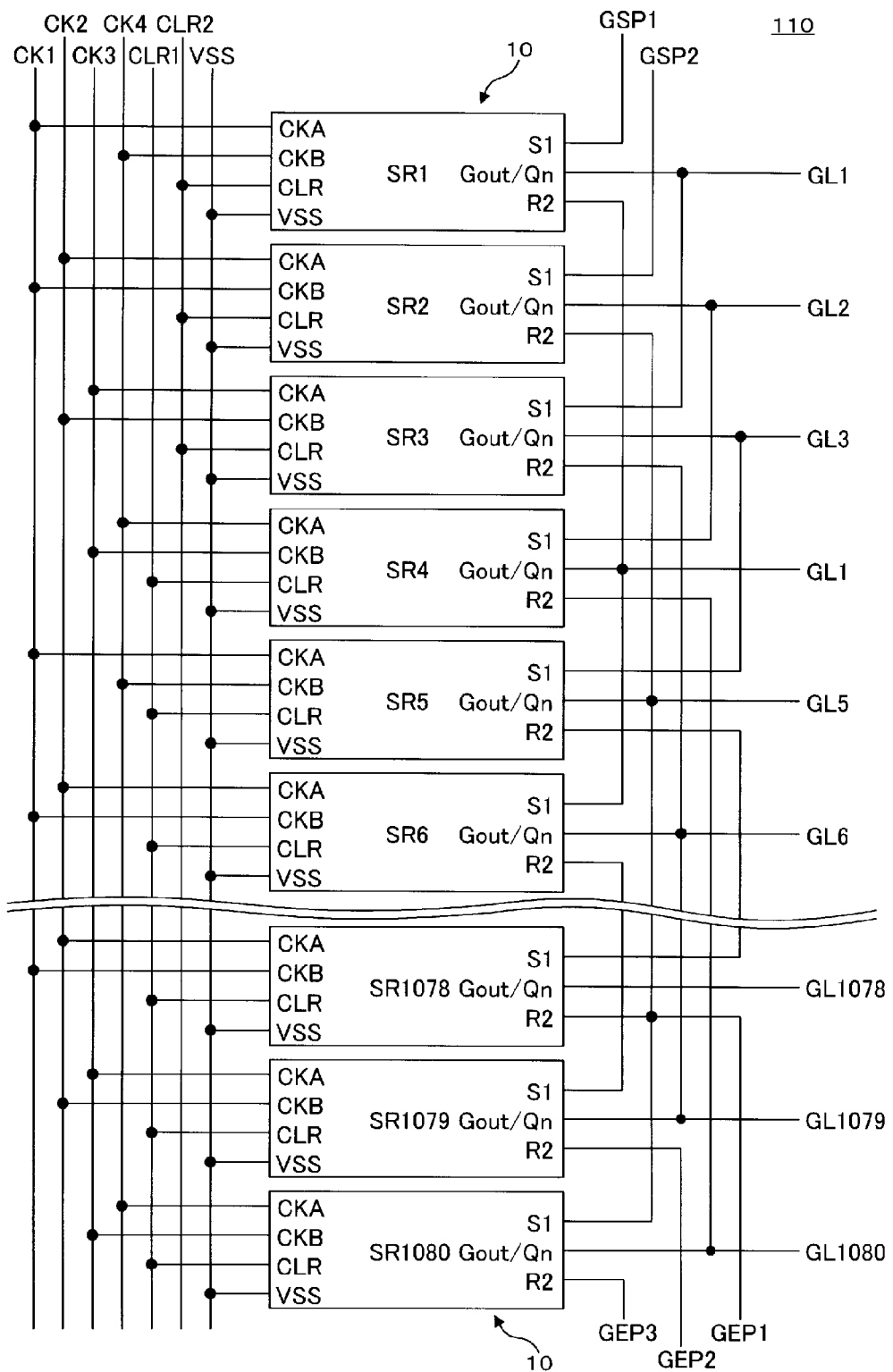
FIG. 4 is a block diagram showing an example of a connection state of the multiple shift registers of the gate driver as the drive circuit of the present embodiment.

In the following, a connection state of the multiple shift registers of the present embodiment is described. FIG. 4 is a block diagram showing an example of the connection state of the multiple shift registers 10 of the gate driver 100 as the drive circuit of the present embodiment. In this specification, the multiple shift registers 10 is also referred to as the shift register group. In the example of FIG. 4, the gate driver 100 consists of 1080 (1080 stages) shift registers SR1-SR1080, however, the number of the shift registers is not limited to 1080. Each of the shift registers 10 has terminals CKA, CKB, CLR, VSS, S1, Gout/Qn, and R2. The gate driver 100 shown in FIG. 4 operates according to four-phase clock signals.

Figure 5:
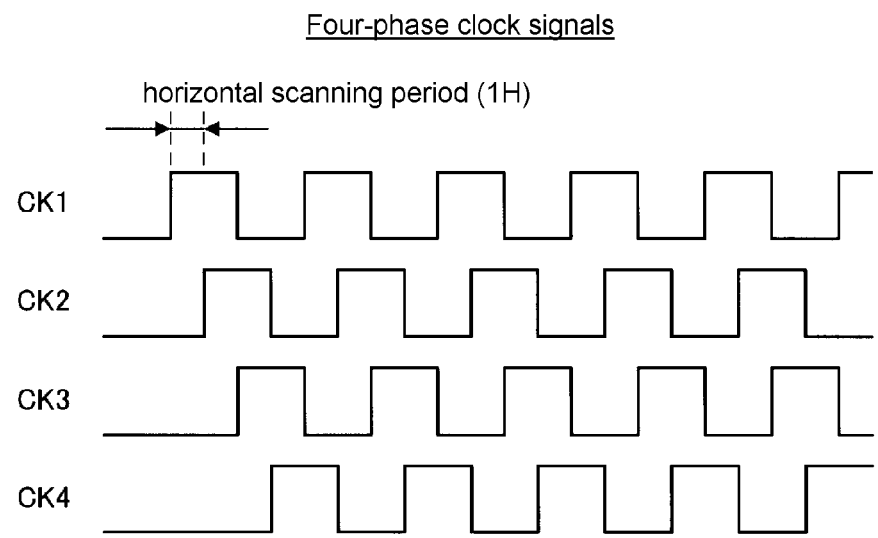
FIG. 5 is an explanatory drawing showing an example of four-phase clock signals.

FIG. 5 is an explanatory drawing showing an example of the four-phase clock signals. As shown in FIG. 5, the four-phase clock signals configured by four clock signals CK1, CK2, CK3, and CK4. The four-phase clock signals are clock signals so as to be configured by four clock signals whose phases are shifted from each other in one cycle. As seen in FIG. 5, it should be understood that the phases of the clock signals CK1, CK2, CK3, and CK4 are shifted from each other. A predetermined horizontal scanning period is a period corresponding to the shifting of the phases, during which one drive signal is output, and is represented as one horizontal scanning period (1H).

Depending on the stage-number of each of the shift registers 10, from the first to the 1080th stage, either two of four clock signals CK1, CK2, CK3, and CK4 are input to the terminals CKA, CKB of each of the shift registers 10. Also, either one of two clear signals CLR1 (a first clear signal) or CLR2 (a second clear signal) is input to the terminal CLR of each of the shift registers 10, depending on the stage-number of each of the shift register 10.

Drive signals (GL1-GL1080) are output from the terminals Gout/Qn of each of the shift registers 10, respectively. The drive signals are also referred to as scan signals. To the terminal S1 of each of the shift registers 10, a drive signal (Qn−2) from a shift register anterior to the above-mentioned shift register 10 in question by two stages is input. To the terminals S1 of the shift registers 10 (SR1-SR2) from the first stage to the second stage, however, gate start pulse signals GSP1-GSP2 are input, instead of an anterior drive signal (Qn−2) in question by two stages. The gate start pulse signals GPS are signals for starting operations of one or more shift registers (predetermined shift register(s)) in the anterior stage sides of the multiple shift registers and are also referred to as shift register operation start signals. It can be appreciated that the gate start pulse signals GSP1-GSP2 are also collectively referred to as GSP.

Also, to the terminal R2 of each of the shift registers 10, a drive signal (Qn+3) from a shift register posterior to the above mentioned shift register in question by three stages is input. To the terminals R2 of the last three shift registers from the 1078th to 1080th stages (SR1078-SR1080), however, gate end pulse signals GEP1-GEP3 are input, instead of posterior drive signals (Qn+3) in question by three stages. The gate end pulse signals GEP1-GEP3 are signals for stopping operations of one or more shift registers (predetermined shift register(s)) in the posterior stages of the multiple shift registers and are also referred to as shift register operation end signals. Also, to the terminal VSS of each of the shift registers 10, a predetermined electric potential is applied. It can be appreciated that the gate end pulse signals GEP1-GEP3 are also collectively referred to as GEP.

In the following, how a noise occurring in a shift register when a clock signal rises is described. First, a configuration of a shift register as a comparative example is described.

Figure 6:
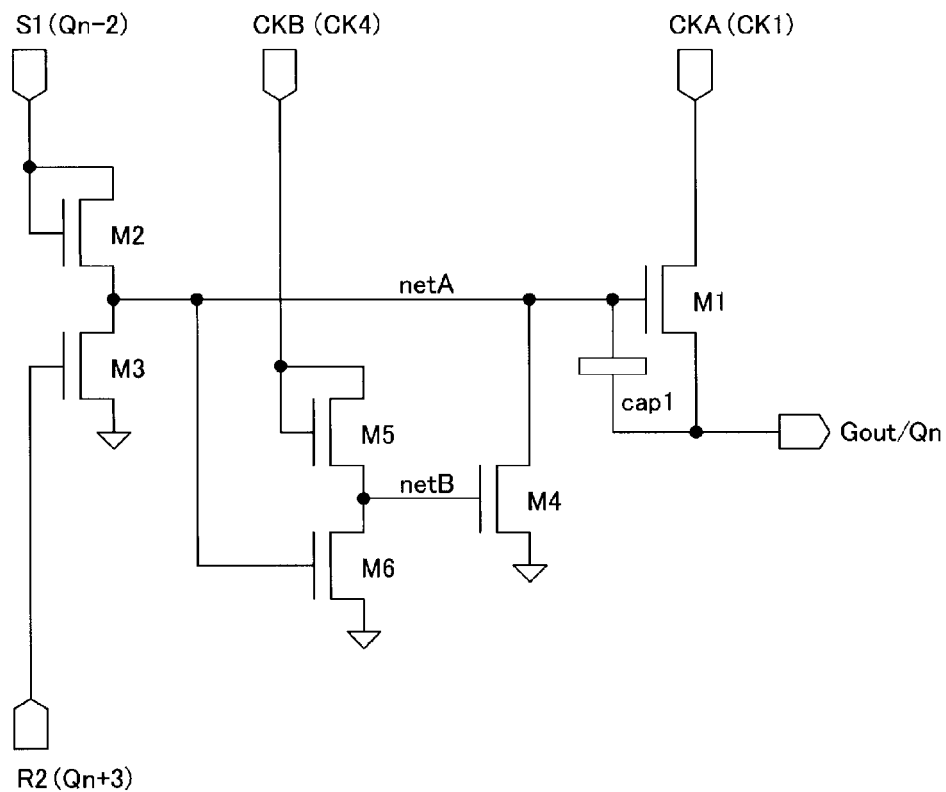
FIG. 6 is a circuit diagram showing an example of the configuration of a shift register as a comparative example.
Figure 7:
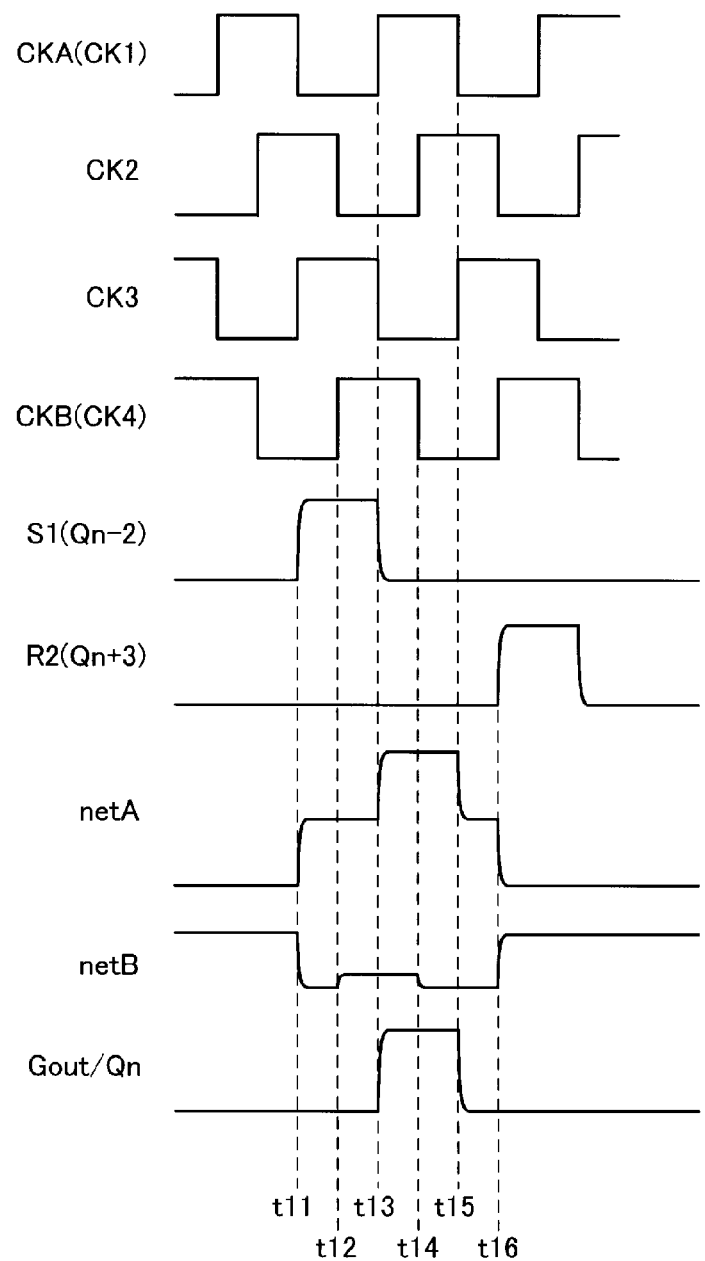
FIG. 7 is a timing chart showing an example of the operation of the shift register shown in FIG. 6.

FIG. 6 is a circuit diagram showing the example of the configuration of the shift register as the comparative example, and FIG. 7 is a timing chart showing the example of the operation of the shift register shown in FIG. 6. The shift register shown in FIG. 6 is configured that thin film transistors M4, M5, M6 are added to the shift register shown in FIG. 2.

The shift register includes an output thin film transistor M1, wherein a predetermined clock signal CKA is input to a drain, and a drive signal is output from a source to an output node (Gout/Qn), a first input thin film transistor M2, wherein a predetermined set signal S1 (an output Qn−2 from a shift register anterior to the above-mentioned shift register in question by two stages) is input to a drain, a source is connected to the gate of the output thin film transistor M1, and a gate is connected to the drain, a second input thin film transistor M3, wherein a drain is connected to an output control node (net A) to which the source of the first input thin film transistor M2 and the gate of the output thin film transistor M1 are connected, a predetermined electric potential is applied to a source, a predetermined reset signal R2 (an output Qn+3 from a shift register posterior to the above-mentioned shift register in question by three stages) is input to a gate, and the like. Also, a capacitor cap1 is connected between the gate and source of the output thin film transistor M1.

In addition, the shift register includes a thin film transistor M4 (a predetermined switching element), wherein a drain is connected to the output control node (net A), a source is connected to a predetermined electric potential, and a gate is connected to a predetermined node (referred to as net B), a thin film transistor M5, wherein a predetermined clock signal CKB is input to a drain, a source is connected to the net B, and a gate is connected to the drain, a thin film transistor M6, wherein a drain is connected to the net B, a source is connected to a predetermined electric potential, a gate is connected to the output control node (net A).

An operation of the shift register shown in FIG. 7 corresponds to the operation of the shift register shown in FIG. 3, and therefore, a difference therebetween is to be described. As shown in FIG. 7, the thin film transistors M4, M5, M6 operate so that the net B is in high level in a state that the output control node (net A) is in low level. The thin film transistor M4, M5, M6 configures a noise suppression circuit for stabilizing the output control node (net A) in low level. As shown in FIG. 7, the predetermined node net B is in high level at or before the time point t11 and at or after the time point t16. Accordingly, the thin film transistor M4 is turned into an on state, maintaining the electric potential of the output control node (net A) at the electric potential of the source of the thin film transistor M4 (a predetermined electric potential).

Figure 8:
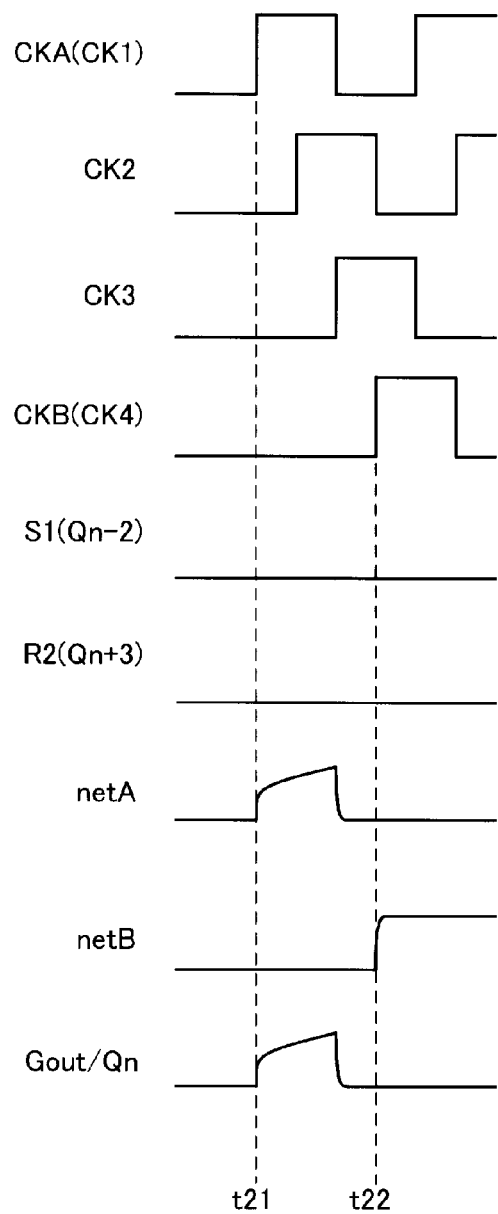
FIG. 8 is an explanatory drawing showing an example of how a noise is generated in the shift register shown in FIG. 6.

FIG. 8 is an explanatory drawing showing an example of how a noise is generated in the shift register shown in FIG. 6. As shown in FIG. 8, in a shift register in which noise may occur, if a clock signal rises to operate a shift register, a set signal S1 (Qn−2) remains in low level when a clock signal CKA rises. Also, a clock signal CKB remains in low level. Also, a reset signal R2 (Qn+3) remains in low level. In such a case, the first input thin film transistor M2, the second input thin film transistor M3, and the thin film transistors M4-M6 are in off states. Thus, the output control node (net A) is in a floating state. Then, when the clock signal CKA is changed from low level to high level at the time point t21, because of a parasitic capacitance existing between the gate and drain of the output thin film transistor M1, the electric potential of the output control node (net A) rises, and the electric potential of the drain of the output thin film transistor M1 also rises, and thereby, the electric potential of the output node (Gout/Qn) rises. As shown in FIG. 8, rise of the electric potential of the output node (Gout/Qn) becomes the noise, causing a malfunction of the circuit.

In the following, a shift register capable of preventing the malfunction of the circuit is described.

Figure 9:
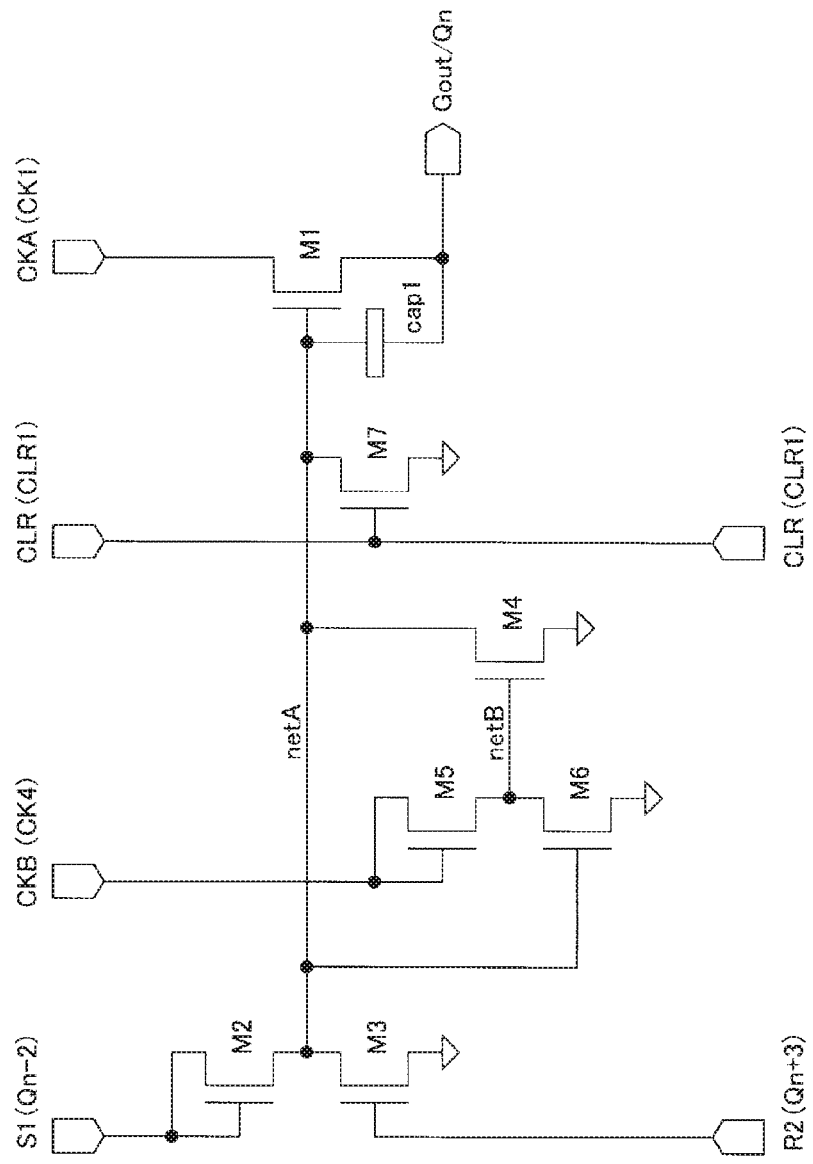
FIG. 9 is a circuit diagram showing the first example of the configuration of a shift register in a drive circuit of the present embodiment.
Figure 10:
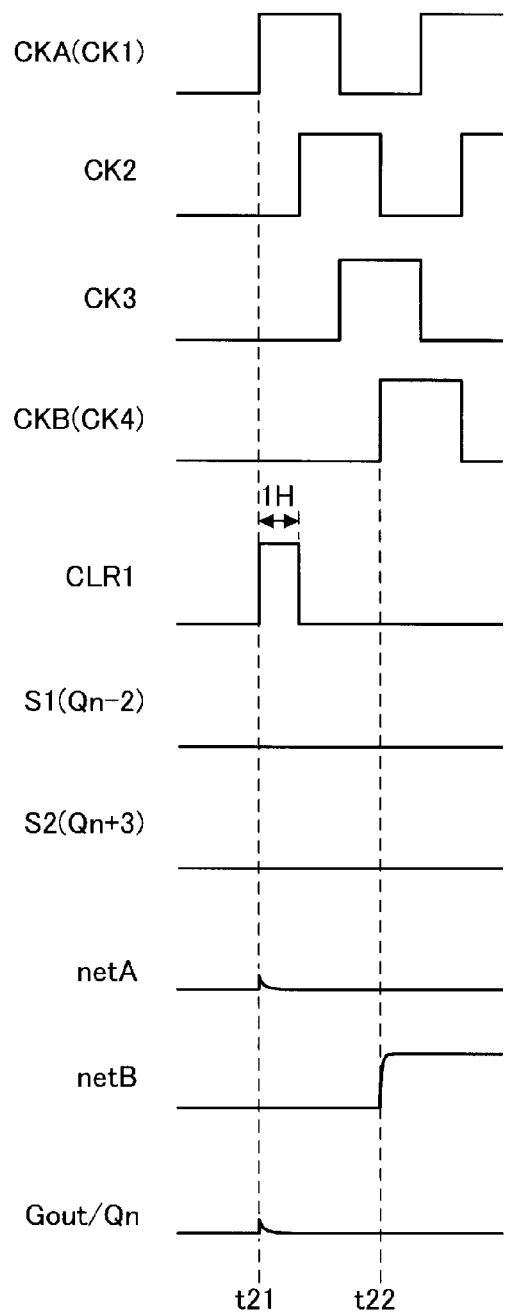
FIG. 10 is a timing chart showing an example of the operation of the shift register 10 shown in FIG. 9.

FIG. 9 is a circuit diagram showing the first example of a configuration of a shift register 10 in the drive circuit of the present embodiment, and FIG. 10 is a timing chart showing an example of the operation of the shift register 10) shown in FIG. 9. As shown in FIG. 9, the first example of the shift register 10 of the present embodiment includes a control thin film transistor M7, in addition to the configuration shown in FIG. 6.

The shift register 10 of the present embodiment includes an output thin film transistor M1, wherein a predetermined clock signal CKA is input to a drain, and a drive signal is output from a source to an output node (Gout/Qn), a first input thin film transistor M2, wherein a predetermined set signal S1 (Qn−2) is input to a drain, and a source is connected to the gate of the output thin film transistor M1, a control thin film transistor M7, wherein a drain is connected to an output control node (net A) to which the source of the first input thin film transistor M2 and the gate of the output thin film transistor M1 are connected, and a source is connected to a predetermined electric potential, and the like.

Then, as shown in FIG. 10, a first clear signal CLR1 is to be high level at or before a time point when the predetermined clock signal CKA rises (more specifically, a time point when the clock signal CKA is to be high level for the first time), is input to the gate of the control thin film transistor M7.

When the first clear signal CLR1 is input to the gate of the control thin film transistor M7, the control thin film transistor M7 is turned into an on state, and the electric potential of the drain (i.e., the output control node, net A) of the control thin film transistor M7 corresponds to the predetermined electric potential (low electric potential) of the source of the control thin film transistor M7. Also, even if the predetermined clock signal CKA was input to the drain of the output thin film transistor M1, because the output control node (net A) is maintained at the low electric potential, it can be prevented that a noise is output from the source via the gate of the output thin film transistor M1, and thus a malfunction of the circuit can be prevented. In FIG. 10, at the time point t21 when the clock signal CKA rises, rise of the electric potential of the output node (Gout/Qn) is suppressed below an acceptable level. Also, because the output control node (net A) is maintained at low electric potential, the charge stored in the output control node (net A) can be discharged.

As shown in FIG. 10, in the shift register 10, a period during which the first clear signal CLR1 is in high level and a period during which the output control node is in high level do not overlap. Namely, in one or more of the multiple shift registers shown in FIG. 4, (referred to as one or more shift registers of the multiple shift registers) such that the predetermined clock signal CKA is input to the drain of the output thin film transistor M1 before the output control node is to be high level, generation of the above-mentioned noise can be prevented. In the example of FIG. 4, the shift registers SR4-SR1080 in the fourth stage or stages thereafter correspond to the one or more shift registers, and the first clear signal CLR1 is to be input to the terminals CLR.

It can be appreciated that, instead of the first clear signal CLR1, the gate start pulse signal GSP1, which rises earlier between the gate start pulse signals GSP1-GSP2, may be input. Sharing the first clear signal CLR1 with the gate start pulse signals GSP1 which rises earlier can avoid increase of the signal wires.

In the configuration including the above-mentioned thin film transistor M4-M6, the signal width of the first clear signal CLR1 (the length of high level) can be defined as M×a predetermined horizontal scanning period. The predetermined horizontal scanning period is a period in which one drive signal is output and is one horizontal scanning period (represented as 1H). When the clock signal CKB (CK4) which is input to the gate of the thin film transistor M4 (indirectly, for example, via the thin film transistor M5) leads, by M phases (M=1 in the example of FIG. 9), a predetermined clock signal CKA (CK1) which is input to the drain of the output thin film transistor M1, in a shift register in which a clock signal which rises Mth or earlier among the plurality of clock signals is input as CKA, the electric potential of the net B has not risen until the time point of input of the signal CKA because CKB is not input until the time point when CKA is input, the electric potential of the output control node (net A) cannot be to be the low electric potential by the thin film transistor M4 and others.

Accordingly, the signal width of the first clear signal is defined as (M×the predetermined horizontal scanning period). As shown in FIG. 10, the signal width of the first clear signal CLR1 is one horizontal scanning period (represented as 1H). The output control node (net A) is thus maintained at low electric potential by CLR1 or net B, regardless of the number of phases of the clock signals, and therefore, it can be prevented that a noise is output from the source via the gate of the output thin film transistor M1, and thereby, a malfunction of the circuit can be prevented.

Figure 11:
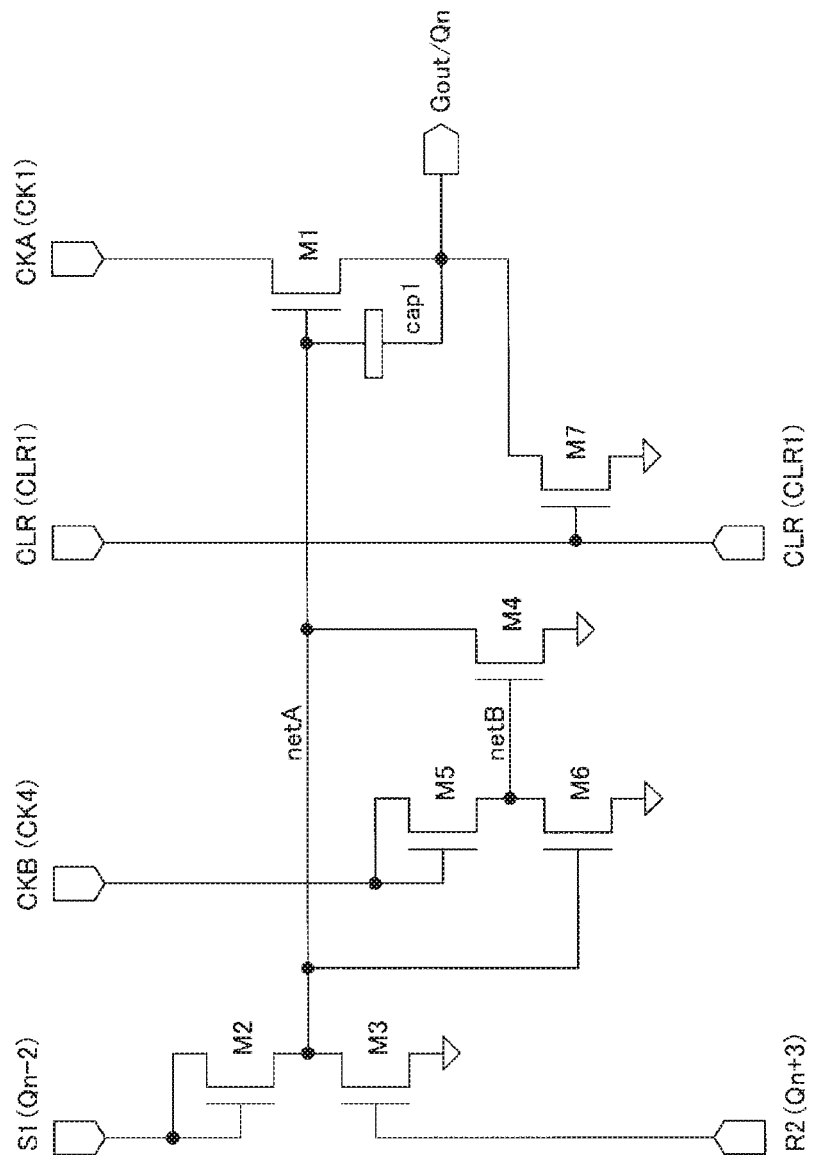
FIG. 11 is a circuit diagram showing the second example of the configuration of a shift register in the drive circuit of the present embodiment.

FIG. 11 is a circuit diagram showing the second example of a configuration of the shift register 10 in the drive circuit of the present embodiment. The difference from the first example shown in FIG. 9 is that the drain of the control thin film transistor M7 is connected to the source of the output thin film transistor M1, instead of the output control node (net A).

Also in the second example, similar to the first example, a first clear signal CLR1 to be high level at or before a predetermined clock signal rises is input to the gate of the control thin film transistor M7. Thereby, the control thin film transistor M7 is turned on, and an electric potential of the drain of the control thin film transistor M7 (i.e., the source of the output thin film transistor M1) corresponds to a predetermined electric potential (low electric potential) of the source of the control thin film transistor M7. Then, even if a predetermined clock signal were input to the drain of the output thin film transistor M1, because the source of the output thin film transistor M1 is maintained at a low electric potential, it can be prevented that a noise is output from the source via the gate of the output thin film transistor M1, and thereby, a malfunction of the circuit can be prevented.

Figure 12:
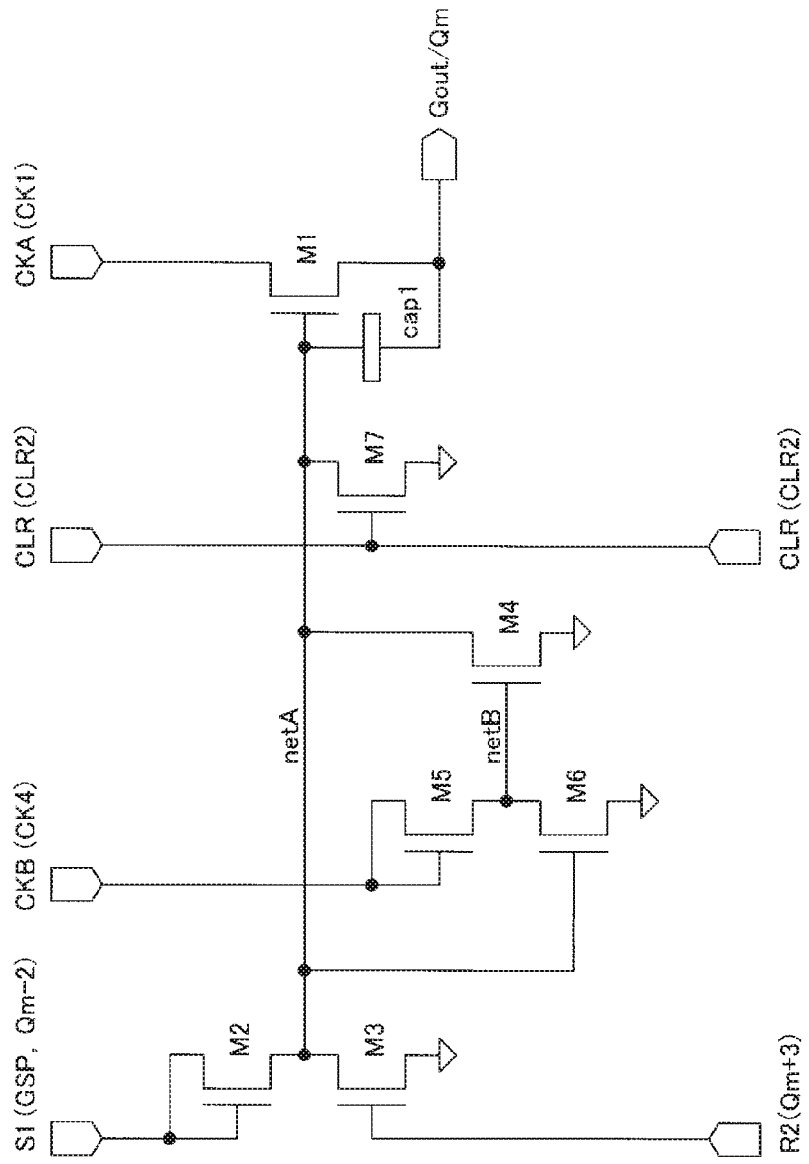
FIG. 12 is a circuit diagram showing the third example of the configuration of a shift register in a drive circuit of the present embodiment.
Figure 13:
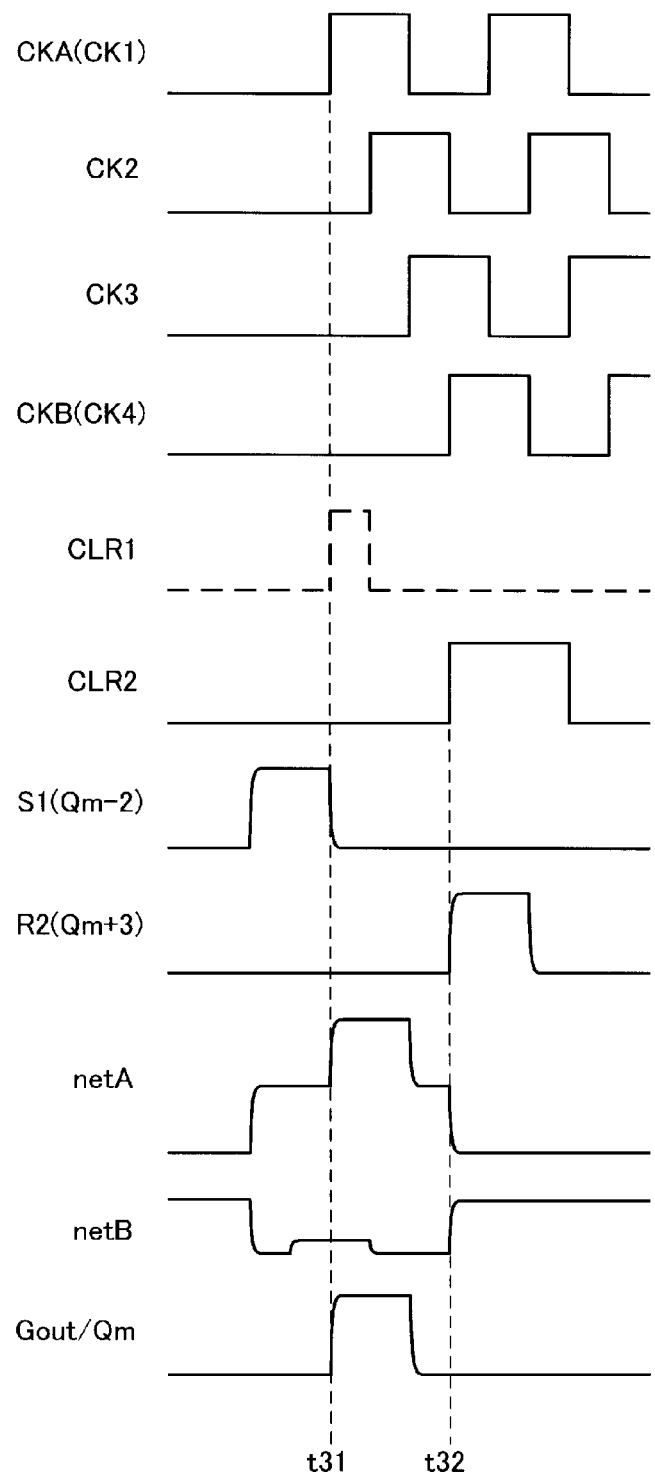
FIG. 13 is a timing chart showing an example of the operation of the shift register shown in FIG. 12.

FIG. 12 is a circuit diagram showing the third example of a configuration of the shift register 10 in the drive circuit of the present embodiment, and FIG. 13 is a timing chart showing an example of the operation of the shift register 10 shown in FIG. 12. As shown in FIG. 12, the difference between the third example of the shift register 10 of the present embodiment and the first example shown in FIG. 9 is that in the third example, a second clear signal CLR2 is input to the gate of the control thin film transistor M7 in a remaining shift register other than the one or more shift registers.

As shown in FIG. 13, in the remaining shift register, a second clear signal CLR2 to be high level at or after a starting time point of a reset period (a period in which a reset signal R2 is in high level) (which is at the time point t32 in FIG. 13) is input to the gate of the control thin film transistor M7.

In the remaining shift register, a period in which a first clear signal CLR1 is in high level and a period the output control node (net A) is in high level overlap. In such a remaining shift register, contradictory operations are performed, because a first clear signal CLR1 is to be high level during a period when the output control node (net A) is at a high electric potential, and thereby, the control thin film transistor M7 operates so that the output control node (net A) is to be a low electric potential. Hence, a second clear signal CLR2 is used instead of the first clear signal CLR1, so that malfunctions of the circuits related to the remaining shift register can be prevented.

Specifically, at or after a reset signal R2 is input to the gate of the second input thin film transistor M3, causing the electric potential of the output control node (net A) to fall toward the low electric potential (at or after a starting time point of a reset period), a second clear signal CLR2 (different from the first clear signal CLR1) is input to the gate of the control thin film transistor M7, so that the output control node (net A) is maintained at an lower electric potential and the charge stored in the output control node (net A) is discharged, and thereby, a malfunction of the circuit can be prevented.

In the example of FIG. 4, the shift registers SR1-SR3 in the first to the third stages correspond to the remaining shift register, wherein second clear signals CLR2 are to be input to the terminals CLR.

It can be appreciated that, instead of the second clear signal. CLR2, either of the gate end pulse signals GEP1-GEP3 may be input. Sharing the second clear signal CLR2 with the either of the gate end pulse signals GEP1-GEP3 can suppress increase of signal wires.

The configurations of the shift registers 10) of the present embodiments are not limited to the configurations shown in FIG. 9, FIG. 11 and FIG. 12. In the following, another configurations are described.

Figure 14:
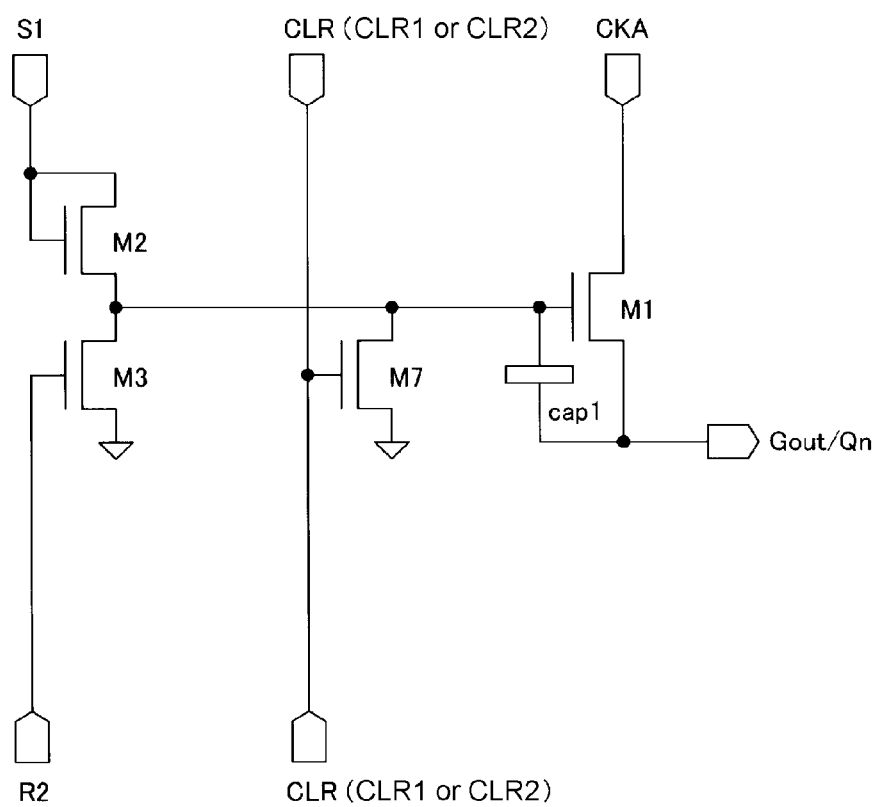
FIG. 14 is a circuit diagram showing the forth example of the configuration of a shift register in a drive circuit of the present embodiment.

FIG. 14 is a circuit diagram showing the forth example of a configuration of the shift register 10 in the drive circuit of the present embodiment. The difference from the configurations shown in FIG. 9, FIG. 11 and FIG. 12 is that it does not include the thin film transistors M4-M6 forming the circuit for the noise reduction. It can be appreciated that, depending on whether the above-mentioned one or more shift registers or the remaining shift register, either of a first clear signal CLR1 or a second clear signal CLR2 is input to the gate of the thin film transistor M7. The fourth example of the operation of the shift register 10 corresponds to those in the first to third examples, and therefore, the description thereof is omitted.

As shown in FIG. 14, in the configuration provided without the thin film transistors M4-M6, if the plurality of clock signals are N phases, a signal width (a length of high level) of a first clear signal CLR1 can be defined as N×a predetermined horizontal scanning period. N-phase clock signals are clock signals configured by N clock signals whose phases are shifted in one cycle. A predetermined horizontal scanning period is a period in which one drive signal is output and is one horizontal scanning period (represented as 1H). In four-phase clock signals, for example, the signal width of the first clear signal is 4 horizontal scanning periods (represented as 4H). When four-phase clock signals are used, in a period until the first-phase to the fourth-phase signals rise for the first time, a noise may be superimposed before electric potential of each of the nodes in the shift registers changes from an original state to a predetermined electric potential state, and a malfunction is likely to occur.

Hence, the signal width of the first clear signal CLR1 is set to be 4 horizontal scanning periods (4H). Consequently, the output control node (net A) is maintained at a low electric potential by the signal CLR1, regardless of the number of the phases of the clock signals, so that it can be prevented that a noise output from the source via the gate of the output thin film transistor M1, and thereby, a malfunction of the circuit can be prevented.

In the examples above, it is described that the clock signals are four-phase clock signals; however, the clock signals are not limited to four-phase clock signals. In the following, an example of eight-phase clock signals is described.

Figure 15:
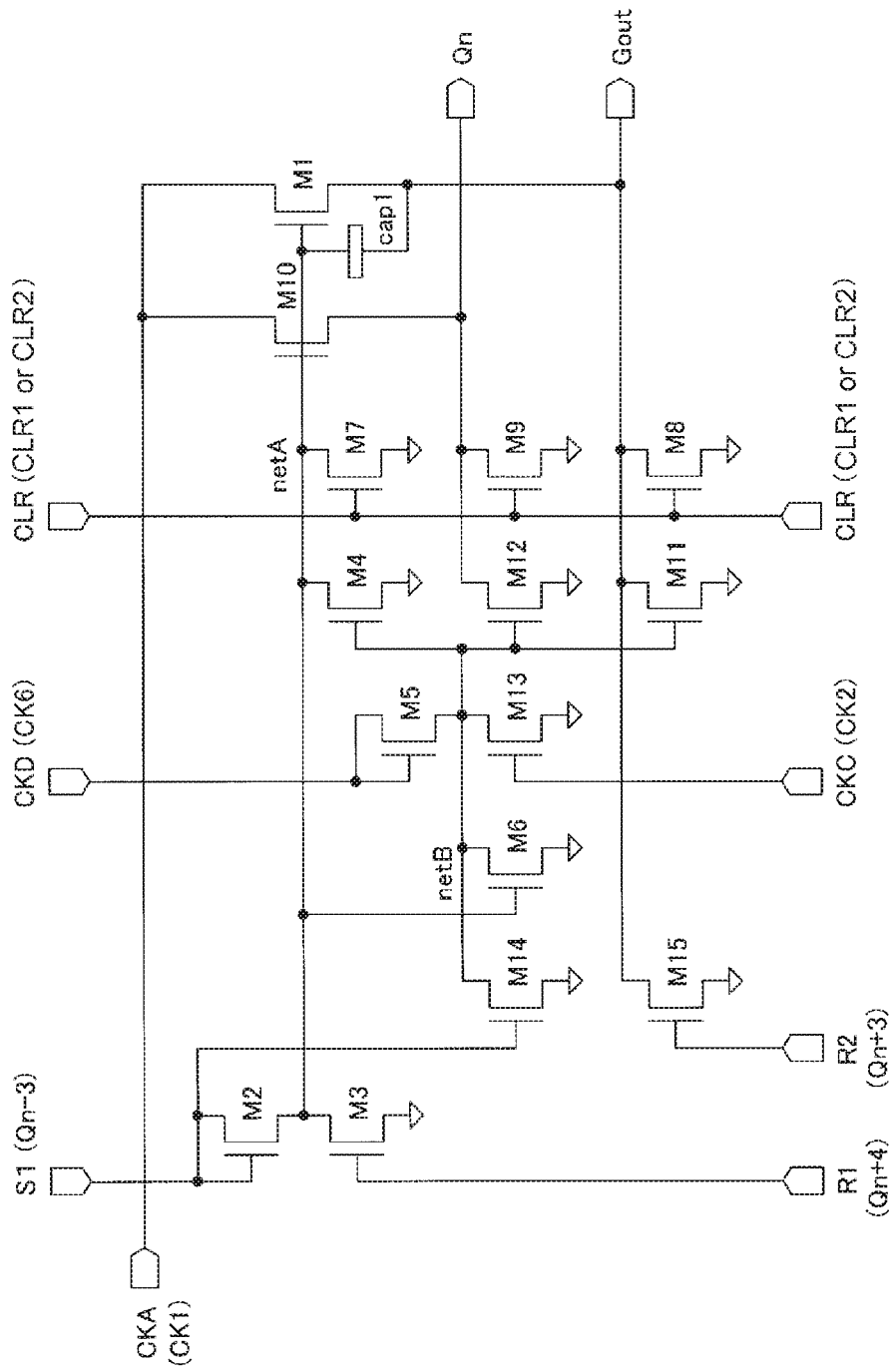
FIG. 15 is a circuit diagram showing the fifth example of the configuration of a shift register in a drive circuit of the present embodiment.
Figure 16:
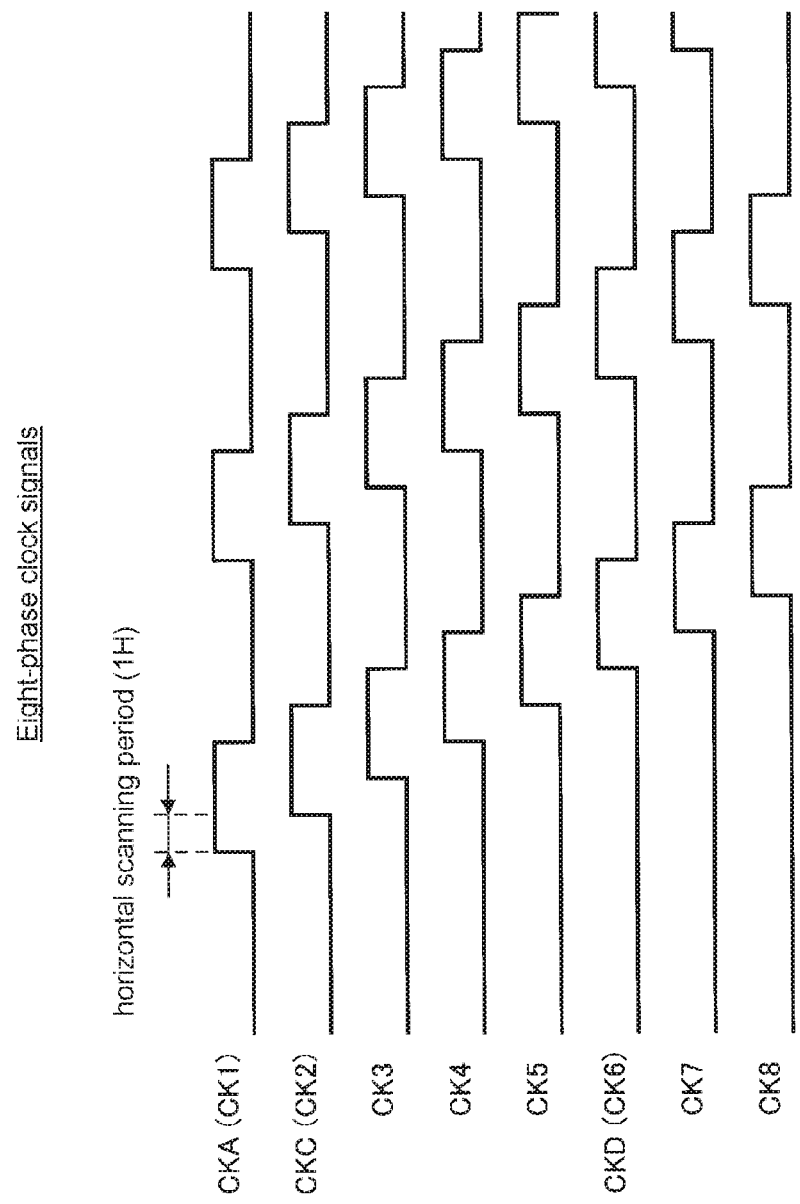
FIG. 16 is an explanatory drawing showing an example of eight-phase clock signals.
Figure 17:
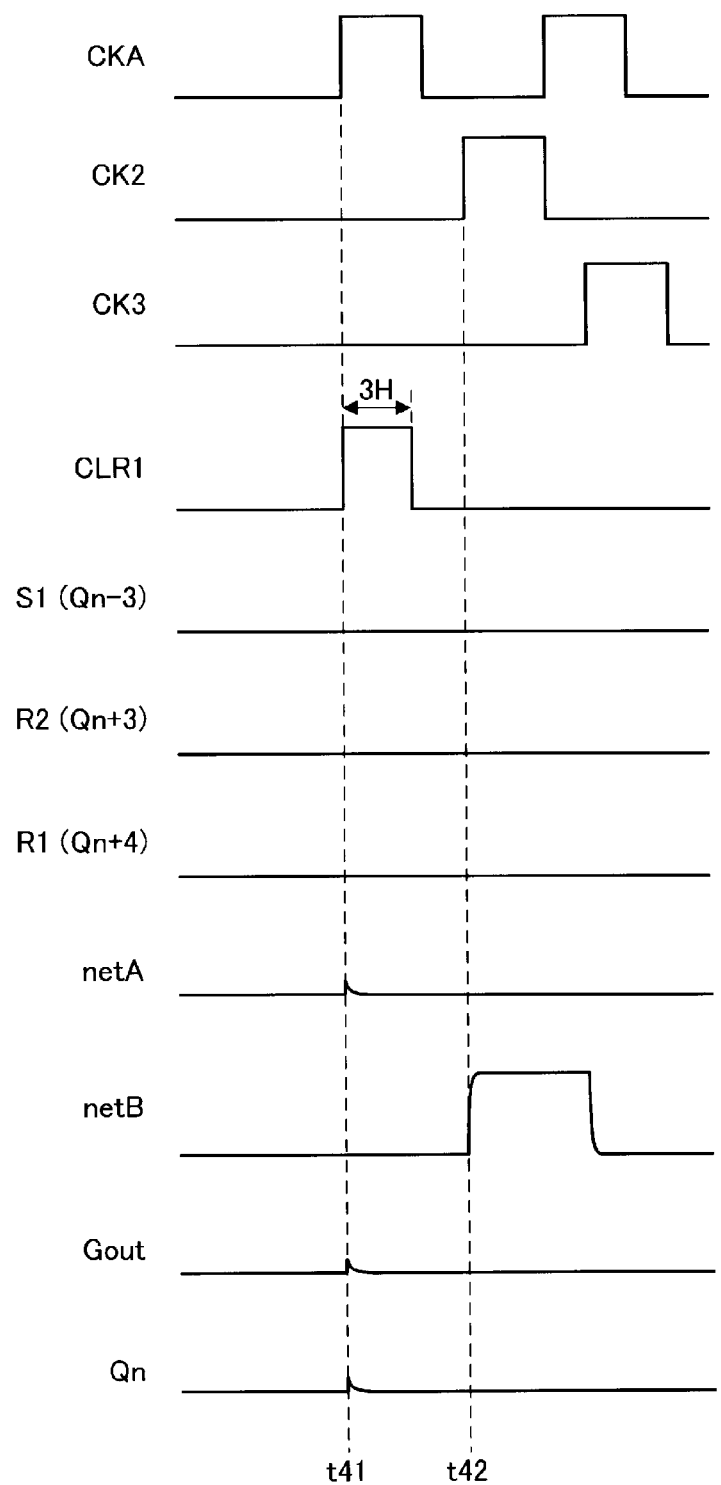
FIG. 17 is a timing chart showing an example of the operation of the shift register shown in FIG. 15.

FIG. 15 is a circuit diagram showing the fifth example of a configuration of the shift register 10 in the drive circuit of the present embodiment, FIG. 16 is an explanatory drawing showing an example of eight-phase clock signals, and FIG. 17 is a timing chart showing an example of an operation of the shift register 15 shown in FIG. 15. The difference from the shift register shown in FIG. 9, FIG. 11 and FIG. 12 is that the output node (Gout/Qn) is separated into an output node (Gout) for outputting a drive signal to a scan line (a signal line) and an output node (Qn) for outputting an output signal to a shift register in another stage, and there are additional thin film transistors M8-15 provided because the clock signals increase from four-phase to eight-phase signals. In FIG. 15, the thin film transistors M1 and M10 are output thin film transistors, the thin film transistor M7 is a control thin film transistor, the thin film transistor M2 is a first input thin film transistor, and the thin film transistor M3 is a second input thin film transistor.

As shown in FIG. 16, eight-phase clock signals configured by eight clock signals CK1-CK8. The eight-phase clock signals are clock signals configured by eight clock signals which are shifted in one cycle. As seen in FIG. 16, it is understood that the phases of the clock signals CK1-CK8 are shifted from each other. A period corresponding to the shifting of the phases is a predetermined horizontal scanning period, and a period in which one drive signal is output, which is represented as one horizontal scanning period (1H).

As shown in FIG. 17, a first clear signal CLR1 to be high level at or before a time point when a predetermined clock signal CKA rises (more specifically, at or before a time point when the clock signal CKA is to be high level for the first time) is input to the gate of the control thin film transistor M7.

When the first clear signal CLR1 is input to the gate of the control thin film transistor M7, the control thin film transistor M7 is turned on, and the electric potential of the drain of the control thin film transistor M7 (i.e., the output control node, net A) corresponds to a predetermined electric potential (low electric potential) of the source of the control thin film transistor M7. Besides, even if the predetermined clock signal CKA were input to the drains of the output thin film transistors M1, M10, the output control node (net A) is maintained at the low electric potential, and therefore, it can be prevented that noises output from the sources via the gates of the output thin film transistor M1, M10, so that a malfunction of the circuit can be prevented. In FIG. 17, at a time point t41 when a clock signal CKA rises, increase of electric potentials of output nodes (Gout) and (Qn) is suppressed below allowable levels. Also, because the output control node (net A) is maintained at the low electric potential, a charge stored in the output control node (net A) can be discharged.

A drive circuit according to the embodiment is a drive circuit with multiple shift resisters to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal, wherein each of the multiple shift registers comprising: an output switching element to output a drive signal from a second controlled terminal, wherein a predetermined clock signal is input to a first controlled terminal; and a first input switching element, wherein a set signal to be high level during a predetermined set period is input to a first controlled terminal, and a second controlled terminal is connected to a control terminal of the output switching element; wherein one or more shift registers of the multiple shift registers comprise: a control switching element, wherein a first controlled terminal is connected to either an output control node to which the second controlled terminal of the first input switching element and the control terminal of the output switching element are connected or the second controlled terminal of the output switching element, and a second controlled terminal is connected to a predetermined electric potential, wherein a first clear signal to be high level at or before a time point when the predetermined clock signal rises is input to a control terminal of the control switching element.

The drive circuit, in which the multiple shift registers having switching elements (thin film transistors) are connected to each other, outputs the drive signal sequentially to each of the plurality of signal wires arranged in the display panel based on the plurality of clock signals.

Each of the multiple shift registers comprises the output switching element to output the drive signal from the second controlled terminal (a source), wherein the predetermined clock signal is input to the first controlled terminal (a drain); the first input switching element, wherein the set signal to be high level during the predetermined set period (which is, for example, an output from a shift register in an anterior stage side to the above-mentioned shift register, or the like) is input to the first controlled terminal (a drain), and the second controlled terminal (a source) is connected to the control terminal (a gate) of the output switching element.

The one or more shift registers of the multiple shift registers comprise the control switching element, wherein the first controlled terminal (a drain) is connected to either the output control node (also referred to as net A) to which the second controlled terminal (a source) of the first input switching element and the control terminal (a gate) of the output switching element are connected or the second controlled terminal (a source) of the output switching element, and the second controlled terminal (a source) is connected to the predetermined electric potential. The first clear signal to be high level at or before the time point when the predetermined clock signal rises is input to the control terminal (a gate) of the control switching element.

Operations of each of the shift registers is generally as follows. When a predetermined set signal is input to the drain of the first input switching element, the first input switching element is turned on because the drain and the gate of the first input switching element are connected, and the electric potential of the output control node (net A) increases toward high level of the set signal. Subsequently, when the predetermined clock signal is input to the drain of the output switching element, the output switching element is in an on state because the gate of the output switching element is connected to the output control node (net A) and thereby the electric potential thereof is to be high, and thus, the source of the output switching element outputs the drive signal.

However, if the predetermined clock signal is input to the drain of the output switching element in a state when the predetermined set signal (such as an output from a shift register in the anterior stage) has not been input to the drain of the first input switching element, a parasitic capacitance of the output switching element (for example, the parasitic capacitance between the drain and the gate) causes that a noise depending on the clock signal is output from the source via the gate of the output switching element. This is similar to a situation where a drive signal is output at a wrong timing when the drive signal should not be output, and it can cause a malfunction of the circuit.

Hence, the first clear signal to be high level at or before the time point when the predetermined clock signal rises is input to the control terminal (the gate) of the control switching element. This turns the control switching element on, and the electric potential of the drain of the control switching element (i.e., the output control node or the source of the output switching element) corresponds to the predetermined electric potential. (low electric potential) of the source of the control switching element. Also, even if the predetermined clock signal were input to the drain of the output switching element, it can be prevented that the noise is output from the source via the gate of the output switching element because the output control node or the source of the output switching element is maintained at the low electric potential, and therefore, a malfunction of the circuit can be prevented.

In the drive circuit according to the present embodiment, in the one or more shift registers, a period in which the first clear signal is in high level and a period in which the output control node is in high level do not overlap.

In the one or more shift registers, the period in which the first clear signal is in high level and the period in which the output control node is in high level do not overlap. Therefore, the generation of the above-mentioned noise can be prevented in such a shift register of the multiple shift registers in which the predetermined clock signal is input to the drain of the output switching element before the output control node is to be high level.

In the drive circuit according to the present embodiment, the first clear signal comprises a shift register operation start signal for starting operation of a predetermined shift register.

The first clear signal comprises the shift register operation start signal for starting operation of the predetermined shift register. The shift register operation start signal, which is also referred to as a gate start pulse signal, is a signal for starting operation of one or more shift registers (the predetermined shift register) in the anterior stages of the multiple shift registers. Sharing the first clear signal with the shift register operation start signal can avoid increase of signal wires.

In the drive circuit according to the present embodiment, each of the multiple shift registers comprises a second input switching element in which a first controlled terminal is connected to the output control node, a predetermined electric potential is applied to a second controlled terminal, and a reset signal to be high level during a predetermined a reset period is applied to a control terminal, a remaining shift register other than the one or more shift registers comprises the control switching element; wherein second clear signal to be high level at or after a starting time point of the reset period is input to the control terminal of the control switching element.

Each of the multiple shift registers comprises the second input switching element in which the first controlled terminal (a drain) is connected to the output control node (net A), the predetermined electric potential is applied to the second controlled terminal (a source), and the reset signal to be high level during the predetermined the reset period (which is, for example, an output from a shift register in a posterior stage side to the above-mentioned shift register) is applied to the control terminal.

The remaining shift register other than the one or more shift registers comprises the control switching element; wherein the second clear signal to be high level at or after the starting time point of the reset period is input to the control terminal (a gate) of the control switching element.

In such a shift register in which the output control node (net A) is at high electric potential (the electric potential is in high level) at a timing when the first clear signal is input, contradictory operations are performed because the control switching element operates so that the output control node (net A) is at low electric potential. Hence, at or after the reset signal is input to the gate of the second input switching element, and thereby, fall the electric potential of the output control node (net A) toward the low electric potential (at or after the starting time point of the reset period), the second clear signal (different from the first clear signal) is input to the gate of the control switching element so as to maintain the output control node (net A) at the lower electric potential, and thereby, the charge stored in the output control node (net A) is discharged, and thus, a malfunction of the circuit can be prevented.

In the drive circuit according to the present embodiment, in the remaining shift register, a period in which the first clear signal is in high level and a period in which the output control node is in high level overlap.

In the remaining shift register, the period in which the first clear signal is in high level and the period in which the output control node is in high level overlap. In such shift registers, contradictory operations are performed because when the first clear signal is to be high level in a period in which the output control node (net A) is at the high electric potential, and thereby, the control thin film transistor operates so that the output control node (net A) is at the low electric potential. Hence, the second clear signal is used instead of the first clear signal so that malfunctions of the circuits related to the remaining shift register can be prevented.

In the drive circuit according to the present embodiment, the second clear signal comprises a shift register operation end signal for ending operation of a predetermined shift register.

The second clear signal comprises the shift register operation end signal. The shift register operation end signal, which is also referred to as a gate end pulse signal, is a signal for ending operation of one or more shift registers (the predetermined shift register) in posterior stages of the multiple shift registers. Sharing the second clear signal with the shift register operation end signal can avoid increase of signal wires.

In the drive circuit according to the present embodiment, when the plurality of clock signals comprises N phases, a signal width of the first clear signal is defined by N×a predetermined horizontal scanning period.

When the plurality of clock signals comprises the N phases, the signal width of the first clear signal is defined by N×the predetermined horizontal scanning period. The N-phase clock signals are a clock signal configured by N clock signals whose phases are shifted in one cycle. The predetermined horizontal scanning period is a period in which one drive signal is output and is one horizontal scanning period (represented as 1H). In four-phase clock signals, for example, a signal width of a first clear signal is 4 horizontal scanning periods (represented as 4H). When the four-phase clock signals are used, in a period until the first-phase to fourth-phase signals rise for the first time, there is a possibility that a noise may be superimposed before the electric potential of each of the nodes in the shift register changes from the original state to the predetermined electric potential state, and therefore, a malfunction is likely to occur. Hence, the signal width of the first clear signal is set to be 4 horizontal scanning periods (4H). The output control node or the first clear signal of the output switching element is thus maintained at low electric potential, regardless of the number of phases of a clock signals, and therefore, it can be prevented that a noise is output from the source via the gate of the output switching element, and a malfunction of the circuit can be prevented.

The drive circuit according to the present embodiment comprises a predetermined switching element in which a first controlled terminal is connected to the output control node, a second controlled terminal is connected to a predetermined electric potential, and a clock signal leading the predetermined clock signal by M phases is input to a control terminal, wherein a signal width of the first clear signal is defined by M×a predetermined horizontal scanning period.

The drive circuit according to the present embodiment comprises the predetermined switching element in which the first controlled terminal is connected to the output control node, the second controlled terminal is connected to the predetermined electric potential, and the clock signal leading the predetermined clock signal by M phases is input to the control terminal. The predetermined switching element is a switching element for suppressing generation of a noise by, for example, changing the electric potential of the output control node (net A) to the low electric potential.

The signal width of the first clear signal is defined by M×the predetermined horizontal scanning period. The predetermined horizontal scanning period is a period in which one drive signal is output and is one horizontal scanning period (represented as 1H). When the clock signal (CKB) which is input (for example, indirectly via another switching element) to the control terminal of the predetermined switching element leads, by M phases, the predetermined clock signal (CKA) which is input to the drain of the output switching element, in a shift register in which a clock signal which rises Mth or earlier among the plurality of clock signals is input as CKA, the electric potential of the output control node (net A) cannot be to be the low electric potential by the predetermined switching element because CKB is not input until CKA is input. Hence, the signal width of the first clear signal is defined as M×the predetermined horizontal scanning period. The output control node or the source of the output switching element is thus maintained at the low electric potential, regardless of the number of phases of the clock signals, and therefore, it can be prevented that a noise is output from the source via the gate of the output switching element, and thus a malfunction of the circuit can be prevented.

A display apparatus according to the present embodiment comprises the drive circuit according to the present embodiment.

The display apparatus capable of preventing a malfunction of the circuit can be realized.

REFERENCE SIGN LIST 10, 15 shift register
100 gate driver
110 shift register group
200 source driver
300 display panel
M1-M15 thin film transistor

The invention claimed is:

1. A drive circuit with multiple shift resisters to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal,
wherein each of the multiple shift registers comprising:
an output switching element to output a drive signal from a second controlled terminal, wherein a predetermined clock signal is input to a first controlled terminal; and
a first input switching element, wherein a set signal to be high level during a predetermined set period is input to a first controlled terminal, and a second controlled terminal is connected to a control terminal of the output switching element;
wherein one or more shift registers of the multiple shift registers comprise:
a control switching element, wherein a first controlled terminal is connected to either an output control node to which the second controlled terminal of the first input switching element and the control terminal of the output switching element are connected or the second controlled terminal of the output switching element, and a second controlled terminal is connected to a predetermined electric potential; and
a predetermined switching element in which a first controlled terminal is connected to the output control node, a second controlled terminal is connected to a predetermined electric potential, and another clock signal leading the predetermined clock signal by M phases and starting to be input later than the predetermined clock is input to a control terminal;
wherein a first clear signal to be high level at or before a time point when the predetermined clock signal first rises is input to a control terminal of the control switching element.

2. The drive circuit of claim 1, wherein in the one or more shift registers, a period in which the first clear signal is in high level and a period in which the output control node is in high level do not overlap.

3. The drive circuit of claim 1, wherein the first clear signal comprises a shift register operation start signal for starting operation of a predetermined shift register.

4. The drive circuit of claim 1, wherein each of the multiple shift registers comprises
a second input switching element in which a first controlled terminal is connected to the output control node, a predetermined electric potential is applied to a second controlled terminal, and a reset signal to be high level during a predetermined reset period is applied to a control terminal,
a remaining shift registers other than the one or more shift registers comprises
the control switching element;
wherein a second clear signal to be high level at or after a starting time point of the reset period is input to the control terminal of the control switching element.

5. The drive circuit of claim 4, wherein in the remaining shift register, a period in which the first clear signal is in high level and a period in which the output control node is in high level overlap.

6. The drive circuit of claim 4, wherein the second clear signal comprises a shift register operation end signal for ending operation of a predetermined shift register.

7. The drive circuit of claim 1, wherein when the plurality of clock signal comprises N phases, a signal width of the first clear signal is defined by N×(a predetermined horizontal scanning period),
wherein N is a natural number.

8. The drive circuit of claim 1, wherein a signal width of the first clear signal is defined by M×(a predetermined horizontal scanning period),
wherein M is a natural number.

9. A display apparatus comprising the drive circuit of claim 1.

* * * * *